US009966423B2

(12) United States Patent
Zhang et al.

(10) Patent No.: US 9,966,423 B2
(45) Date of Patent: May 8, 2018

(54) OLED SUBSTRATE, MANUFACTURING METHOD THEREOF, OLED DISPLAY PANEL AND ELECTRONIC EQUIPMENT

(71) Applicant: BOE TECHNOLOGY GROUP CO., LTD., Beijing (CN)

(72) Inventors: Baoxia Zhang, Beijing (CN); Cuili Gai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 14/912,907

(22) PCT Filed: Jul. 14, 2015

(86) PCT No.: PCT/CN2015/083919
§ 371 (c)(1),
(2) Date: Feb. 18, 2016

(87) PCT Pub. No.: WO2016/150030
PCT Pub. Date: Sep. 29, 2016

(65) Prior Publication Data

US 2017/0040405 A1 Feb. 9, 2017

(30) Foreign Application Priority Data

Mar. 20, 2015 (CN) .......................... 2015 1 0123403

(51) Int. Cl.
*H01L 27/32* (2006.01)
*H01L 51/56* (2006.01)
(Continued)

(52) U.S. Cl.
CPC .......... *H01L 27/3276* (2013.01); *H01L 27/32* (2013.01); *H01L 51/50* (2013.01);
(Continued)

(58) Field of Classification Search
CPC . H01L 27/3276; H01L 51/5206; H01L 51/56; H01L 51/5221
See application file for complete search history.

(56) References Cited

FOREIGN PATENT DOCUMENTS

| | | |
|---|---|---|
| CN | 1582072 | 2/2005 |
| CN | 1809235 A | 7/2006 |

(Continued)

OTHER PUBLICATIONS

Office Action in Chinese Application No. 201510123403.X dated Mar. 1, 2017, with English translation. 11 pages.

(Continued)

*Primary Examiner* — Joseph L Williams
(74) *Attorney, Agent, or Firm* — Womble Bond Dickinson (US) LLP

(57) ABSTRACT

The embodiments of the present invention provide an OLED substrate, a manufacturing method thereof, an OLED display panel and an electronic equipment. The OLED substrate and the manufacturing method thereof provided by the embodiments of the present invention apply a transparent first cathode and a reflective second cathode, realizing top emitting and bottom emitting in a first region covered by electronic elements and a second region other than the first region respectively, increasing the light emitting area and the aperture ratio of pixels, thereby realizing double-sided display of OLED display device.

18 Claims, 2 Drawing Sheets

(51) Int. Cl.
*H01L 51/52* (2006.01)
*H01L 51/50* (2006.01)

(52) U.S. Cl.
CPC .......... *H01L 51/52* (2013.01); *H01L 51/5206* (2013.01); *H01L 51/5221* (2013.01); *H01L 51/56* (2013.01)

(56) References Cited

FOREIGN PATENT DOCUMENTS

| | | |
|---|---|---|
| CN | 103325318 A | 9/2013 |
| CN | 103730484 | 4/2014 |
| CN | 104701351 | 6/2015 |

OTHER PUBLICATIONS

International Search Report and Written Opinion with English Language Translation, dated Dec. 31, 2015, Application No. PCT/CN2015/083919.

Office Action in Chinese Application No. 201510123403.X dated Jul. 7, 2017, with English translation.

OLED SUBSTRATE, MANUFACTURING METHOD THEREOF, OLED DISPLAY PANEL AND ELECTRONIC EQUIPMENT

FIELD OF THE INVENTION

The present invention relates to the field of display technology, particularly to an OLED substrate, a manufacturing method thereof, an OLED display panel and an electronic equipment.

BACKGROUND OF THE INVENTION

OLED (Organic Light-Emitting Diode) display is a kind of all solid state, active light emitting display. OLED display has the characteristics of high brightness, high contrast, ultra thin and light, low power consumption, unlimited visual angle range, wide working temperature range and so on, therefore it is considered as an emerging next generation display.

In the existing OLED technology, a region covered by an electronic element can not emit light. However, the light emitting material is coated on an entire surface, and electroluminescent material is very expensive, so the electroluminescent material of lightless parts covered by electronic elements is wasted. The OLED display device in the prior art is limited by the accuracy of the evaporation, the actual OLED light emitting area is small, the aperture ratio is very low, and most of the pixel region is not used. According to the OLED display device of the prior art, the aperture area is usually up to 30%, the brightness of OLED display is low, and sometimes it can not meet the requirements of users.

SUMMARY OF THE INVENTION

In view of this, the embodiments of the present invention provide an OLED substrate increasing the light emitting area and the aperture ratio of pixels, thereby realizing double-sided display of OLED display device.

An embodiment of the present invention provides an OLED substrate comprising:

a basal substrate; an array of OLED pixels located over the basal substrate; each OLED pixel having a pixel region and an electronic element located over the basal substrate;

a transparent anode covering the pixel region; each pixel region comprising a first region covering the electronic element and a second region other than the first region;

a transparent first cathode covering the pixel region;

a light emitting layer located between the anode and the first cathode, the light emitting layer covering the pixel region; and a reflective second cathode located over the first cathode and covering the second region.

Since the anode and the first cathode are transparent, top emitting can be realized within the first region, which is not covered by the second cathode; since the second cathode is reflective, bottom emitting can then be realized within the second region. The OLED substrate provided by the embodiments of the present invention applies a transparent first cathode and a reflective second cathode, realizing top emitting and bottom emitting in a first region covered by electronic elements and a second region other than the first region respectively, increasing the light emitting area and the aperture ratio of pixels, thereby realizing double-sided display of OLED display device.

In particular, the electronic element is a thin film transistor.

Optionally, in any row of the OLED pixels, the second cathodes of respective OLED pixels are connected with each other to form a strip cathode.

Optionally, the first cathode is electronically connected to the second cathode.

Optionally, the second cathode is formed on the upper surface of the first cathode with a fine metal mask process.

Optionally, the material of the anode is indium tin oxide.

Optionally, the material of the first cathode is MgAg alloy or indium zinc oxide.

Optionally, the first cathode is formed on the array of OLED pixels with an evaporation process.

Optionally, the material of the second cathode is reflective metal.

Optionally, the material of the second cathode is aluminum or silver.

Optionally, the area of the first region is equal to the area of the second region.

An embodiment of the present invention also provides an OLED display panel, which comprises the OLED substrate as described above.

An embodiment of the present invention also provides an electronic equipment, which comprises the OLED display panel as described above.

An embodiment of the present invention further provides a method for manufacturing an OLED substrate, comprising:

providing a basal substrate; forming an array of OLED pixels over the basal substrate; each OLED pixel having a pixel region and an electronic element located over the basal substrate;

forming a transparent anode covering the pixel region; each pixel region comprising a first region covering the electronic element and a second region other than the first region;

forming a transparent first cathode covering the pixel region;

forming a light emitting layer located between the anode and the first cathode, the light emitting layer covering the pixel region; and forming a reflective second cathode located over the first cathode and covering the second region.

Since the anode and the first cathode are transparent, top emitting can be realized within the first region, which is not covered by the second cathode; since the second cathode is reflective, bottom emitting can then be realized within the second region. The method for manufacturing an OLED substrate provided by the embodiments of the present invention applies a transparent first cathode and a reflective second cathode, realizing top emitting and bottom emitting in a first region covered by electronic elements and a second region other than the first region respectively, increasing the light emitting area and the aperture ratio of pixels, thereby realizing double-sided display of OLED display device.

In particular, the electronic element is a thin film transistor.

Optionally, in any row of the OLED pixels, the second cathodes of respective OLED pixels are connected with each other to form a strip cathode.

Optionally, the first cathode is electronically connected to the second cathode.

Optionally, the second cathode is formed on the upper surface of the first cathode with a fine metal mask process.

Optionally, the material of the anode is indium tin oxide.

Optionally, the material of the first cathode is MgAg alloy or indium zinc oxide.

Optionally, the first cathode is formed on the array of OLED pixels with an evaporation process.

Optionally, the material of the second cathode is reflective metal.

Optionally, the material of the second cathode is aluminum or silver.

Optionally, the area of the first region is equal to the area of the second region.

DETAILED DESCRIPTION OF THE INVENTION

The specific implementations of the OLED substrate, manufacturing method thereof, OLED display panel and electronic equipment provided by the embodiments of the present invention will be explained in detail below with reference to the drawings.

In the context of the present disclosure, the term “transparent” means being capable of transmitting light at least generated by the OLED substrate; the term “reflective” means being capable of reflecting light at least generated by the OLED substrate.

Figure 1:
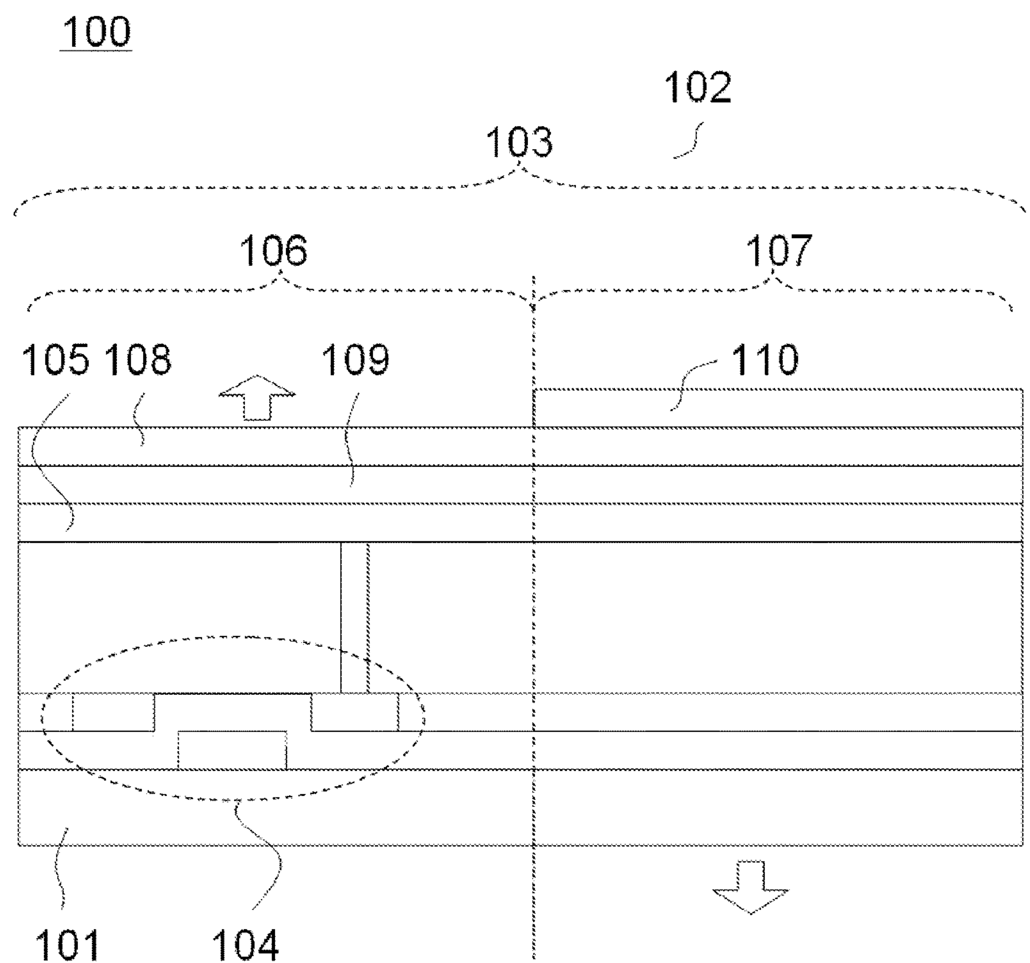
FIG. 1 is a local schematic diagram of a cross section of an OLED substrate according to an embodiment of the present invention.

FIG. 1 is a local schematic diagram of a cross section of an OLED substrate according to an embodiment of the present invention, wherein the OLED substrate 100 comprises:

a basal substrate 101; an array of OLED pixels 102 located over the basal substrate 101; each OLED pixel 102 having a pixel region 103 and an electronic element 104 located over the basal substrate 101;

a transparent anode 105 covering the pixel region 103; each pixel region 103 comprising a first region 106 covering the electronic element and a second region 107 other than the first region 106;

a transparent first cathode 108 covering the pixel region 103;

a light emitting layer 109 located between the anode 105 and the first cathode 108, the light emitting layer 109 covering the pixel region 103; and a reflective second cathode 110 located over the first cathode 108 and covering the second region 107.

Since the anode and the first cathode are transparent, top emitting can be realized within the first region, which is not covered by the second cathode; since the second cathode is reflective, bottom emitting can then be realized within the second region. The OLED substrate provided by the embodiments of the present invention applies a transparent first cathode and a reflective second cathode, realizing top emitting and bottom emitting in a first region covered by electronic elements and a second region other than the first region respectively, increasing the light emitting area and the aperture ratio of pixels, thereby realizing double-sided display of OLED display device.

In particular, the electronic element is a thin film transistor.

Thin film transistors are often used as switching control elements in OLED pixels, and thin film transistors are generally not suitable for light transmission. Therefore, realizing top emitting within the first region covered by the thin film transistor can effectively avoid the interference of the thin film transistor to the OLED emission. However, those skilled in the art can understand, other switch control elements or other electronic elements suitable for OLED substrates can also be arranged in the first region, so as to effectively avoid the interference of other electronic elements to the OLED emission.

Figure 2:
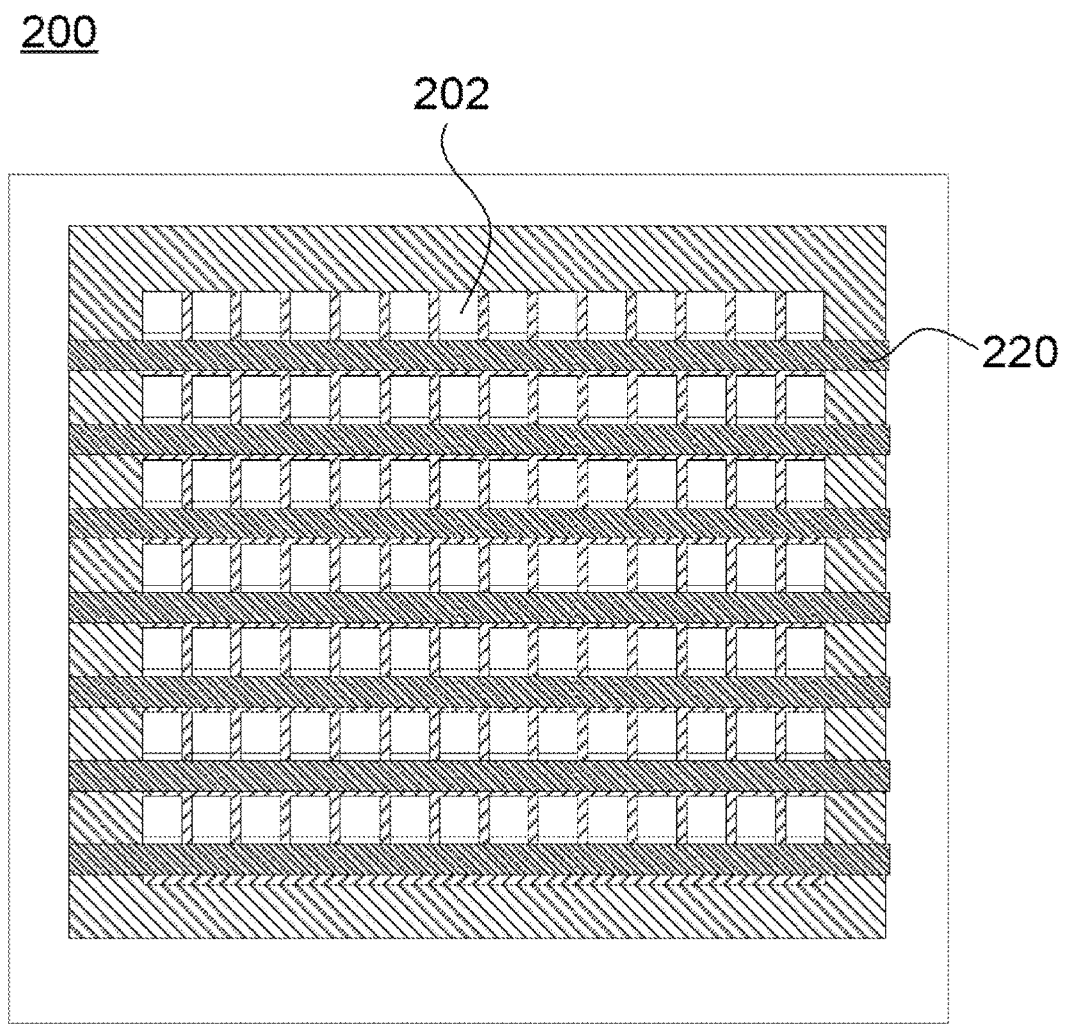
FIG. 2 is a top view of an OLED substrate according to an embodiment of the present invention.

FIG. 2 is a top view of an OLED substrate 200 according to an embodiment of the present invention. Optionally, in any row of the OLED pixels 202, the second cathodes of respective OLED pixels are connected with each other to form a strip cathode 220.

In the context of the present disclosure, the arrangement direction of a “row” of OLED pixels is perpendicular to the arrangement direction of the first region and the second region in a single OLED pixel. Such an arrangement of the strip cathode makes it simple to form second cathodes of respective OLED pixels with a mask process, which can also avoid light leakage between the OLED pixels.

Optionally, the first cathode is electronically connected to the second cathode.

The thickness of the transparent first cathode is typically small, thus the resistance of the transparent first cathode is relatively large; by electronically connecting the first cathode to the second cathode, the first cathode and the second cathode can have a same electric potential, thereby reducing the resistance.

Optionally, the second cathode is formed on the upper surface of the first cathode with a fine metal mask process. The fine metal mask process is suitable for processing metal material into the reflective second cathode; the size of the second cathode can also be controlled according to requirements.

Optionally, the material of the anode is indium tin oxide. Indium tin oxide has good transparency in the visible light band, so it is suitable to be used as the material of the anode in the embodiment of the invention.

Optionally, the material of the first cathode is MgAg alloy or indium zinc oxide.

MgAg alloy or indium zinc oxide has good transparency in the visible light band, so it is suitable to be used as the material of the first cathode in the embodiment of the invention.

Optionally, the first cathode is formed on the array of OLED pixels with an evaporation process.

With the evaporation process, an integral and uniform first cathode can be formed on the OLED pixel array of the OLED substrate.

Optionally, the material of the second cathode is reflective metal. Optionally, the material of the second cathode is aluminum or silver.

By applying reflective metal (for example, but not limited to aluminum, silver and so on), the bottom emitting within the second region can be realized; moreover, the reflective metal can also be used as an auxiliary electrode, reducing the resistance of the OLED component.

Optionally, the area of the first region is equal to the area of the second region.

The first region and the second region having a same area make the top emitting and bottom emitting have approximately a same intensity. However, those skilled in the art can understand that the area ratio between the first region and the second region can also be adjusted according to different requirements.

An embodiment of the present invention also provides an OLED display panel, which comprises the OLED substrate as described above.

An embodiment of the present invention also provides an electronic equipment, which comprises the OLED display panel as described above. The electronic equipment can be an equipment such as OLED TV, mobile phone, notebook computer, navigator or tablet computer comprising the OLED display panel.

An embodiment of the present invention further provides a method for manufacturing an OLED substrate, comprising:

providing a basal substrate; forming an array of OLED pixels over the basal substrate; each OLED pixel having a pixel region and an electronic element located over the basal substrate;

forming a transparent anode covering the pixel region; each pixel region comprising a first region covering the electronic element and a second region other than the first region;

forming a transparent first cathode covering the pixel region;

forming a light emitting layer located between the anode and the first cathode, the light emitting layer covering the pixel region; and forming a reflective second cathode located over the first cathode and covering the second region.

Since the anode and the first cathode are transparent, top emitting can be realized within the first region, which is not covered by the second cathode; since the second cathode is reflective, bottom emitting can then be realized within the second region. The method for manufacturing an OLED substrate provided by the embodiments of the present invention applies a transparent first cathode and a reflective second cathode, realizing top emitting and bottom emitting in a first region covered by electronic elements and a second region other than the first region respectively, increasing the light emitting area and the aperture ratio of pixels, thereby realizing double-sided display of OLED display device.

In particular, the electronic element is a thin film transistor.

Thin film transistors are often used as switching control elements in OLED pixels, and thin film transistors are generally not suitable for light transmission. Therefore, realizing top emitting within the first region covered by the thin film transistor can effectively avoid the interference of the thin film transistor to the OLED emission. However, those skilled in the art can understand, other switch control elements or other electronic elements suitable for OLED substrates can also be arranged in the first region, so as to effectively avoid the interference of other electronic elements to the OLED emission.

FIG. 2 is a top view of an OLED substrate 200 according to an embodiment of the present invention. Optionally, in any row of the OLED pixels 202, the second cathodes of respective OLED pixels are connected with each other to form a strip cathode 220.

In the context of the present disclosure, the arrangement direction of a "row" of OLED pixels is perpendicular to the arrangement direction of the first region and the second region in a single OLED pixel. Such an arrangement of the strip cathode makes it simple to form second cathodes of respective OLED pixels with a mask process, which can also avoid light leakage between the OLED pixels.

Optionally, the first cathode is electronically connected to the second cathode.

The thickness of the transparent first cathode is typically small, thus the resistance of the transparent first cathode is relatively large; by electronically connecting the first cathode to the second cathode, the first cathode and the second cathode can have a same electric potential, thereby reducing the resistance.

Optionally, the second cathode is formed on the upper surface of the first cathode with a fine metal mask process.

The fine metal mask process is suitable for processing metal material into the reflective second cathode; the size of the second cathode can also be controlled according to requirements.

Optionally, the material of the anode is indium tin oxide.

Indium tin oxide has good transparency in the visible light band, so it is suitable to be used as the material of the anode in the embodiment of the invention.

Optionally, the material of the first cathode is MgAg alloy or indium zinc oxide.

MgAg alloy or indium zinc oxide has good transparency in the visible light band, so it is suitable to be used as the material of the first cathode in the embodiment of the invention.

Optionally, the first cathode is formed on the array of OLED pixels with an evaporation process.

With the evaporation process, an integral and uniform first cathode can be formed on the OLED pixel array of the OLED substrate.

Optionally, the material of the second cathode is reflective metal. Optionally, the material of the second cathode is aluminum or silver.

By applying reflective metal (for example, but not limited to aluminum, silver and so on), the bottom emitting within the second region can be realized; moreover, the reflective metal can also be used as an auxiliary electrode, reducing the resistance of the OLED component.

Optionally, the area of the first region is equal to the area of the second region.

The first region and the second region having a same area make the top emitting and bottom emitting have approximately a same intensity. However, those skilled in the art can understand that the area ratio between the first region and the second region can also be adjusted according to different requirements.

The OLED substrate and the manufacturing method thereof provided by the embodiments of the present invention apply a transparent first cathode and a reflective second cathode, realizing top emitting and bottom emitting in a first region covered by electronic elements and a second region other than the first region respectively, increasing the light emitting area and the aperture ratio of pixels, thereby realizing double-sided display of OLED display device.

Apparently, the skilled person in the art can make various modifications and variations to the present invention without departing from the spirit and scope of the present invention. In this way, provided that these modifications and variations of the present invention belong to the scopes of the claims of the present invention and the equivalent technologies thereof, the present invention also intends to cover these modifications and variations.

The invention claimed is:

1. An OLED substrate, comprising:

a basal substrate; an array of OLED pixels located over the basal substrate; each OLED pixel having a pixel region and an electronic element located over the basal substrate;

a transparent anode covering the pixel region; each pixel region comprising a first region covering the electronic element and a second region other than the first region;

a transparent first cathode covering the pixel region;

a light emitting layer located between the anode and the first cathode, the light emitting layer covering the pixel region; and a reflective second cathode located over the first cathode and covering the second region; wherein in any row of the OLED pixels, the second cathodes of respective OLED pixels are connected with each other to form a strip cathode.

2. The OLED substrate as claimed in claim 1, wherein the electronic element is a thin film transistor.

3. The OLED substrate as claimed in claim 1, wherein the first cathode is electronically connected to the second cathode.

4. The OLED substrate as claimed in claim 1, wherein the second cathode is formed on the upper surface of the first cathode with a fine metal mask process.

5. The OLED substrate as claimed in claim 1, wherein the material of the anode is indium tin oxide.

6. The OLED substrate as claimed in claim 1, wherein the material of the first cathode is MgAg alloy or indium zinc oxide; or, the first cathode is formed on the array of OLED pixels with an evaporation process.

7. The OLED substrate as claimed in claim 1, wherein the material of the second cathode is reflective metal; or, the material of the second cathode is aluminum or silver.

8. The OLED substrate as claimed in claim 1, wherein the area of the first region is equal to the area of the second region.

9. An OLED display panel, comprising the OLED substrate as claimed in claim 1.

10. An electronic equipment, comprising the OLED display panel as claimed in claim 9.

11. A method for manufacturing the OLED substrate as claimed in claim 1, comprising:

providing a basal substrate; forming an array of OLED pixels over the basal substrate;

each OLED pixel having a pixel region and an electronic element located over the basal substrate;

forming a transparent anode covering the pixel region; each pixel region comprising a first region covering the electronic element and a second region other than the first region;

forming a transparent first cathode covering the pixel region;

forming a light emitting layer located between the anode and the first cathode, the light emitting layer covering the pixel region; and forming a reflective second cathode located over the first cathode and covering the second region; wherein in any row of the OLED pixels, the second cathodes of respective OLED pixels are connected with each other to form a strip cathode.

12. The method as claimed in claim 11, wherein the electronic element is a thin film transistor.

13. The method as claimed in claim 11, wherein the first cathode is electronically connected to the second cathode.

14. The method as claimed in claim 11, wherein the second cathode is formed on the upper surface of the first cathode with a fine metal mask process.

15. The method as claimed in claim 11, wherein the material of the anode is indium tin oxide.

16. The method as claimed in claim 11, wherein the material of the first cathode is MgAg alloy or indium zinc oxide; or, the first cathode is formed on the array of OLED pixels with an evaporation process.

17. The method as claimed in claim 11, wherein the material of the second cathode is reflective metal; or, the material of the second cathode is aluminum or silver.

18. The method as claimed in claim 11, wherein the area of the first region is equal to the area of the second region.

* * * * *